(12) United States Patent
Opaits et al.

(10) Patent No.: US 10,224,187 B1
(45) Date of Patent: Mar. 5, 2019

(54) DETECTING PARTIAL UNCLAMPING OF A SUBSTRATE FROM AN ESC OF A SUBSTRATE PROCESSING SYSTEM

(71) Applicant: LAM RESEARCH CORPORATION, Fremont, CA (US)

(72) Inventors: Dmitry Opaits, Fremont, CA (US); Benny Wu, Fremont, CA (US); Jorge Luque, Redwood City, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/889,625

(22) Filed: Feb. 6, 2018

(51) Int. Cl.
*H01L 21/00* (2006.01)
*H01J 37/32* (2006.01)
*H01L 21/67* (2006.01)
*H01L 21/683* (2006.01)
*H01L 21/66* (2006.01)

(52) U.S. Cl.
CPC .. *H01J 37/32697* (2013.01); *H01J 37/32449* (2013.01); *H01J 37/32972* (2013.01); *H01J 37/32981* (2013.01); *H01L 21/67017* (2013.01); *H01L 21/67253* (2013.01); *H01L 21/6833* (2013.01); *H01L 22/10* (2013.01); *H01J 2237/334* (2013.01); *H01J 2237/335* (2013.01); *H01J 2237/3321* (2013.01)

(58) Field of Classification Search
CPC ........... H01J 37/32697; H01J 37/32449; H01J 37/32972; H01J 37/32981; H01J 2237/3321; H01J 2237/334; H01J 2237/335; H01L 21/67017; H01L 21/67253; H01L 21/6833; H01L 22/20
See application file for complete search history.

(56) References Cited

U.S. PATENT DOCUMENTS

2004/0259276 A1* 12/2004 Yue .................... H01J 37/32935
 438/5
2006/0215338 A1* 9/2006 Yokouchi .......... H01L 21/67253
 361/56

* cited by examiner

*Primary Examiner* — Richard A Booth (57) ABSTRACT

A partial unclamping detection system is provided and includes a light emission circuit, a spectrometer, and a system controller. The light emission circuit is configured to emit light at an area of a substrate while the substrate is electrostatically clamped to an electrostatic chuck of a substrate processing system. The spectrometer is configured to detect light reflected off the substrate and generate a first output signal based on the detected light. The system controller is configured to: detect changes in the first output signal; detect changes in a flow rate of a gas supplied to a backside of the substrate; and based on both the changes in the first output signal and the changes in the flow rate, determine whether a partial unclamping event of the substrate has occurred.

20 Claims, 4 Drawing Sheets

DETECTING PARTIAL UNCLAMPING OF A SUBSTRATE FROM AN ESC OF A SUBSTRATE PROCESSING SYSTEM

FIELD

The present disclosure relates to detecting partial unclamping of substrates from electrostatic chucks in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, a plasma enhanced chemical vapor deposition (PECVD) process, a physical vapor deposition (PVD) process, an ion implantation process, and/or other etch, deposition, and cleaning processes.

During an etching process, a thin film on a substrate is etched. Etching usually includes either wet chemical etching or dry etching. Dry etching may be performed by generating inductively-coupled plasma (ICP). The inductively-coupled plasma may be generated by coils arranged outside of a processing chamber adjacent to a dielectric window. Process gas flowing inside the processing chamber is ignited to create the ICP. While being etched, the substrate may be arranged on an electrostatic chuck (ESC) in a processing chamber of the corresponding substrate processing system.

SUMMARY

A partial unclamping detection system is provided and includes a light emission circuit, a spectrometer, and a system controller. The light emission circuit is configured to emit light at an area of a substrate while the substrate is electrostatically clamped to an electrostatic chuck of a substrate processing system. The spectrometer is configured to detect light reflected off the substrate and generate a first output signal based on the detected light. The system controller is configured to: detect changes in the first output signal; detect changes in a flow rate of a gas supplied to a backside of the substrate; and based on both the changes in the first output signal and the changes in the flow rate, determine whether a partial unclamping event of the substrate has occurred.

In other features, a partial unclamping detection method is provided and includes: emitting light at an area of a substrate while the substrate is electrostatically clamped to an electrostatic chuck of a substrate processing system; detecting light reflected off the substrate and generating a first output signal based on the detected light; detecting changes in the first output signal; detecting changes in a flow rate of a gas supplied to a backside of the substrate; and based on both the changes in the first output signal and the changes in the flow rate, determining whether a partial unclamping event of the substrate has occurred.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

During an etching process, a spectral reflectometer may be used to monitor, for example, depths of etched structures of a substrate and to cease etching when predetermined depths have been reached. The spectral reflectometer may be used to monitor color patterns across a surface of the substrate being etched. A controller may then adjust etching process durations based on the detected patterns. In addition, a gas (e.g., helium) may be provided to a backside of the substrate for temperature control of the substrate during the etching process. The gas is provided to an enclosed area between the substrate and an electrostatic chuck (ESC). By directing the gas across the backside of the substrate, the corresponding substrate processing system is able to uniformly control temperatures across the substrate. A backside manometer and a flow valve may be used to monitor and maintain a pressure of the gas at the backside of the substrate.

During processing, a substrate is placed on an ESC, which often includes one or more electrodes disposed near a top surface of the ESC. Current is supplied to the electrodes to generate an electrostatic clamping force, which holds the substrate in a target position and in a fully clamped state on the ESC. While at the target position and in the fully clamped state, a pressure and flow rate of a gas provided to a backside of the substrate remain within predetermined ranges of set pressure and flow rate values. A minor leak (e.g., 2 standard cubic centimeters per minute (SCCMs)) may exist between the substrate and the ESC, for example along a peripheral edge of the substrate. A flow rate of the gas is adjusted to account for this leak and to maintain a set predetermined pressure of the gas.

In certain situations, the substrate may move from the target position to a partially unclamped position and may no longer be in a fully clamped state. This movement may be caused, for example, when: an improper processing chamber seasoning recipe does not fully remove a previously applied conditioning film and as a result leaves an excessive amount of deposition material on the ESC; particles exist on a backside of a substrate; hardware of an ESC is faulty and/or incorrectly installed; and/or applied and/or detected parameters (e.g., clamping voltage and/or substrate bias compensation voltage levels) are not accurate resulting in an incorrect electrostatic clamping force. Partial unclamping can negatively affect processing of a substrate and result in the substrate being scrapped, thereby leading to waste and increased cost.

When dislodged from the target position, the substrate may be in a partially unclamped state or a fully unclamped state. A partially unclamped state refers to when the substrate (i) is slightly misaligned laterally (or moved from the target position by more than a first predetermined amount, but less than or equal to a second predetermined amount), or (ii) has a slightly raised portion (e.g., a distance between a top surface of the ESC and a portion of the substrate is greater than or equal to a first predetermined distance, but less than or equal to a second predetermined distance). The lifting of a portion of a substrate is referred to as a "shift in parallelism" between the substrate and the ESC, such that opposing surfaces of the substrate and the ESC are no longer parallel to one another and/or angles between the opposing surfaces has increased. This movement (or partial unclamping event) may result in a gas leak between the substrate and the ESC and/or an increase in an amount of gas leaking between the substrate and the ESC. The controller may increase the flow rate of the gas to maintain the set predetermined pressure as a result of the increased amount of gas leaking from between the substrate and the ESC. As an example, a partial unclamping of a substrate may be associated with an increase in a flow rate of a backside gas of greater than or equal to 25% of the flow rate provided prior to the partial unclamping event, but less than 60%.

A fully unclamped state refers to when the substrate has moved to such an extent (i.e. more than the second predetermined amount or separated from the ESC by more than the second predetermined distance) that the flow rate of the gas has increased by more than a predetermined amount (e.g., increased by more than 60%). The stated percentages and other percentages and values disclosed herein are provided as examples and may be different depending on the application (e.g., the operating environment, the processing system, the ESC used, the electrostatic clamping forces, the backside gas pressures, the temperatures, etc.). Traditionally, a partial unclamping event would go unnoticed and would not trigger an alarm.

The examples set forth herein include partial unclamping detection systems and methods for detecting partial unclamping of substrates from ESCs. The partial unclamping detection systems include: spectral reflectometers for detecting changes in reflected light directed at first sides of substrates; and controllers and/or sensors for detecting changes in flow rates of gas supplied to backsides of the substrates. The backsides of the substrates are on opposite sides of the substrates than the first sides of the substrates. The partial unclamping detection systems, based on the detected changes in the reflected light and the changes in the flow rates, detect partial unclamping of the substrates.

Figure 1:
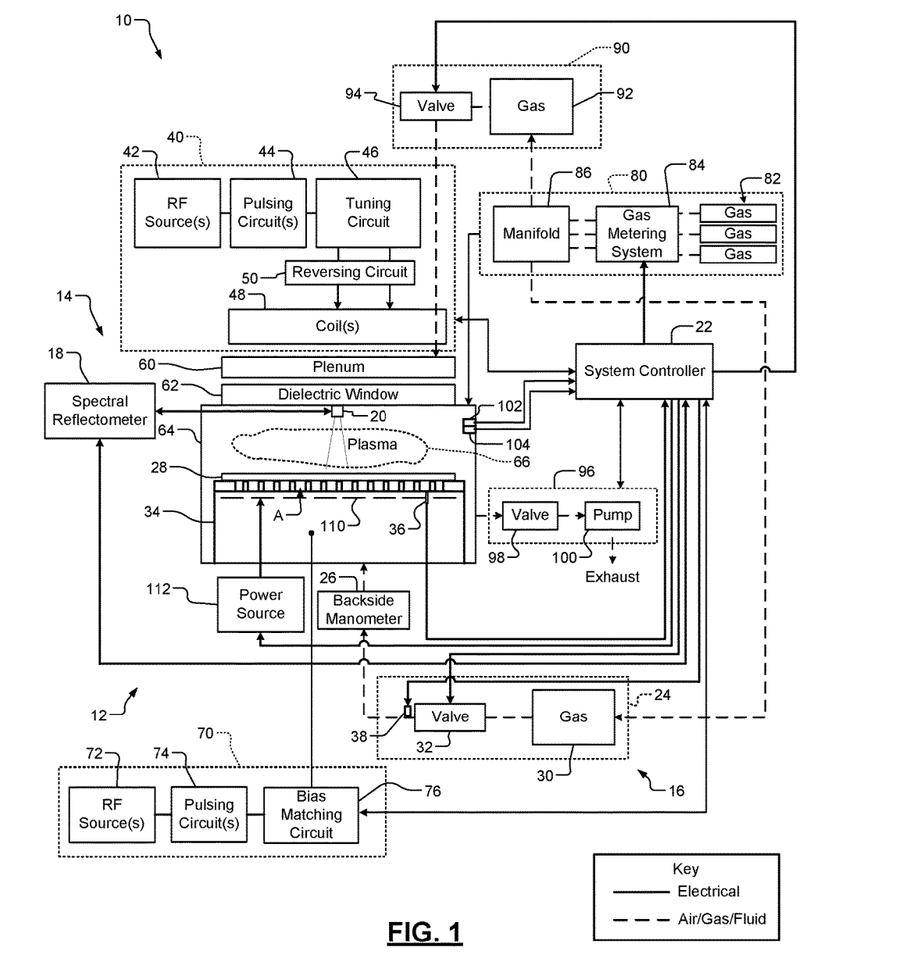
FIG. 1 is a functional block diagram of an example of an inductively coupled plasma (ICP) substrate processing system incorporating a partial unclamping detection system in accordance with an embodiment of the present disclosure.

FIG. 1 shows an inductively coupled plasma (ICP) substrate processing system 10 incorporating a partial unclamping detection system 12. The partial unclamping detection system includes a light processing circuit 14 and a backside gas circuit 16. The light processing circuit 14 may include a spectral reflectometer 18, a collimator 20 and a system controller 22. The backside gas circuit 16 may include the system controller 22, a first gas delivery system 24, and a backside manometer 26. The spectral reflectometer 18 outputs light signals to the collimator 20, which directs the light signals at a substrate 28. The light signals are reflected off the substrate 28 and back through the collimator 20 to the spectral reflectometer 18. The spectral reflectometer 18 generates an output signal based on the reflected light signals relayed by the collimator 20 to the spectral reflectometer 18. The output signal is provided to the system controller 22.

The first gas delivery system 24 includes a gas source 30 and a valve 32. The system controller 22 controls operation of the valve 32 to maintain a predetermined pressure of a backside gas (e.g., helium) being supplied from the first gas delivery system 24 to an area A between the substrate 28 and an ESC 34. Although an example ESC 34 is shown, the examples disclosed herein are applicable to other ESCs. The system controller 22 adjusts the position (or opening) of the valve 32 based on a pressure of the backside gas detected by the manometer 26 to maintain the predetermined pressure. The system controller 22 may adjust the pressure and/or the flow rate of the backside gas to adjust a temperature of the substrate 28. In an embodiment, one or more temperature sensors may be used to detect temperatures of the backside gas. A couple of example temperature sensors 36, 38 are shown. The pressure and/or flow rate of the backside gas may be adjusted based on the detected temperatures.

The system controller 22 determines whether the substrate 28 is in a partially unclamped state based on the output signal received from the spectral reflectometer 18 and the position of the valve 32. In an embodiment, the system controller 22 determines a flow rate (e.g., an absolute flow rate and/or a mass flow rate) of the backside gas. If a mass flow rate is determined, the mass flow rate may be determined based on the temperatures detected by the temperature sensors 36, 38. The partial unclamped state may be detected based on the output signal received from the spectral reflectometer 18 and the determined flow rate.

Although FIG. 1 shows an ICP substrate processing system, the embodiments disclosed herein are applicable to transformer coupled plasma (TCP) systems, electron cyclotron resonance (ECR) plasma systems, capacitive coupled plasma (CCP) systems and/or other substrate processing systems. The embodiments are applicable to processes, chemically enhanced plasma vapor deposition (CEPVD) processes, ion implantation processes, and/or other etch, deposition, and cleaning processes.

The substrate processing system 10 further includes a coil driving circuit 40. In some examples, the coil driving circuit 40 may include an RF source 42, a pulsing circuit 44, and a tuning circuit 46. The pulsing circuit 44 controls a TCP envelope of a RF signal and varies a duty cycle of the TCP envelope during operation.

The tuning circuit 46 may be directly connected to one or more inductive coils 48. Alternatively, the tuning circuit 46 may be connected by an optional reversing circuit 50 to one or more of the coils 48. The tuning circuit 46 tunes an output of the RF source 42 to a set frequency and/or a set phase, matches an impedance of the coils 48 and splits power between the coils 48. The reversing circuit 50 is used to selectively switch the polarity of current through one or more of the coils 48.

In some examples, a plenum 60 may be arranged between the coils 48 and a dielectric window 62 to control the temperature of the dielectric window 62 with hot and/or cold air flow. The dielectric window 62 is arranged along one side of a processing chamber 64. The processing chamber 64 includes the ESC 34. Process gas is supplied to the processing chamber 64 and plasma 66 is generated inside of the processing chamber 64. The plasma 66 etches an exposed surface of the substrate 28. The substrate processing system 10 may further include a RF bias circuit 70. The RF bias circuit 70 may include an RF source 72, a pulsing circuit 74 and a bias matching circuit 76, which may be used to bias the ESC 34.

A gas delivery system 80 may be used to supply a process gas mixture to the processing chamber 64. The gas delivery system 80 may include process and inert gas sources 82, a gas metering system 84, such as valves and mass flow controllers, and a manifold 86. Another gas delivery system 90 may be used to deliver a gas from a gas source 92 via a valve 94 to the plenum 60. The gas may include cooling gas (air) that is used to cool the coils 48 and the dielectric window 62. An exhaust system 96 includes a valve 98 and pump 100 to remove reactants from the processing chamber 64 by purging or evacuation.

A voltage (V) and current (I) probe (or VI probe) 102 is arranged in the processing chamber 64 to detect voltage and current of the plasma 66. In addition, a phase/magnitude detector 104 is arranged in the processing chamber 64 to detect a phase and magnitude of the plasma 66.

The system controller 22 may be used to control processing of the substrate 28. The system controller 22 monitors system parameters and controls delivery of the gas mixture, striking, maintaining and extinguishing the plasma 66, removal of reactants, supply of cooling gas, etc. Additionally, the system controller 22 may control various aspects of the coil driving circuit 40 and the RF bias circuit 70.

The ESC 34 may include one or more electrodes (or an electrode array) 110. The one or more electrodes 110 may be connected to and receive power from a power source 112, which may be controlled by the system controller 22. The one or more electrodes 110 may be used to control an amount of electrostatic force created to clamp the substrate 28 to the ESC 34.

Figure 2:
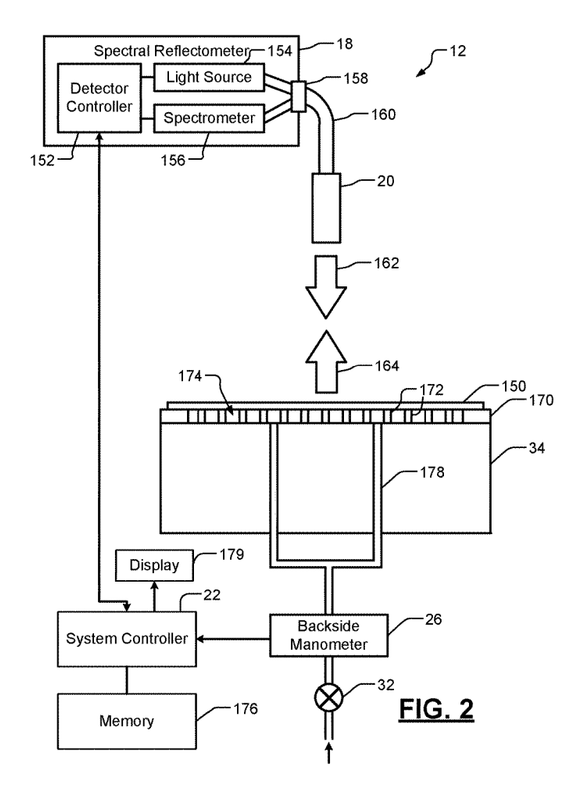
FIG. 2 is a functional block diagram of the partial unclamping detection system of FIG. 1 illustrating detection of a fully clamped state.

FIG. 2 shows the partial unclamping detection system 12 of FIG. 1 and illustrates detection of a fully clamped state of a substrate 150. The partial unclamping detection system 12 includes the spectral reflectometer 18, the collimator 20, the system controller 22, the backside manometer 26, the valve 32, and the ESC 34. The spectral reflectometer 18 may include a detector controller 152, a light source 154, a spectrometer (or spectrophotometer when absolute units are monitored) 156, an interface 158, and/or other hardware for emission and reception of light signals. The other hardware may include reflectors, optic fibers and/or bundles, etc. The light source 154, the interface 158, the collimator 20 and/or other corresponding hardware are part of a light emission circuit. The detector controller 152 controls operation of the light source 154 to emit light in the form of light signals from the interface 158 to the collimator 20 via a fiber optic bundle 160. The light is emitted from the collimator 20, as indicated by arrow 162, and directed at a center of the substrate 150. The light is reflected off the substrate 150, as indicated by arrow 164, and detected by the collimator 20. When the substrate 150 is in a target position and in a fully clamped state, the light is reflected back along approximately the same path that was originally used to emit the light to the substrate 150. The reflected light is received at the spectrometer 156, which generates a first output signal indicative of the reflected light received. The detector controller 152 may convert the first output signal from the spectrometer 156 to a second output signal, which is provided to the system controller 22. As an example, the first output signal may include a spectrum of light intensity levels (or counts) versus wavelengths (in nanometers) of the reflected light. This information (i.e. the counts versus wavelengths) may be provided as the second output signal or may be combined to provide a single number of counts versus time signal. As an example, the second output signal may be generated by averaging, summing, weighting and/or performing other processing of the counts of one or more selected ones of the wavelengths of the first output signal.

In an embodiment, the spectral reflectometer 18 does not include the detector controller 152. In this embodiment, the system controller 22 directly controls the light source 154 and receives the output of the spectrometer 156.

The substrate 150 may be disposed on a ring 170 of the ESC 34. The ESC 34 may include mesas 172. The mesas 172 minimize the contact area between the ESC 34 and the substrate 150. The mesas 172 may have various size, shape, placement, and quantity patterns. The substrate 150 is disposed on and held against the mesas 172 by electrostatic clamping. A backside gas is supplied to an area 174 between the substrate 150 and the ESC 34. The backside gas fills a volume (or cavity) defined by an upper surface of the ESC 34, the mesas 172, the ring 170 (if included) and the substrate 150. The ring 170 may be integrally formed as part of the ESC 34.

The ESC 34 may include one or more channels 178 for supplying the backside gas to the area 174. The backside gas may be supplied to the ESC 34 through the valve 32 and the manometer 26. The system controller 22 controls operation of the valve 32 and monitors changes in positions of the valve 32, which as disclosed herein is one of the indicators of whether a substrate on the ESC 34 is in a partially unclamped state. As stated above, the system controller 22 also monitors the output of the spectral reflectometer 18, which is another indicator of whether a substrate on the ESC 34 is in a partially unclamped state.

Figure 3:
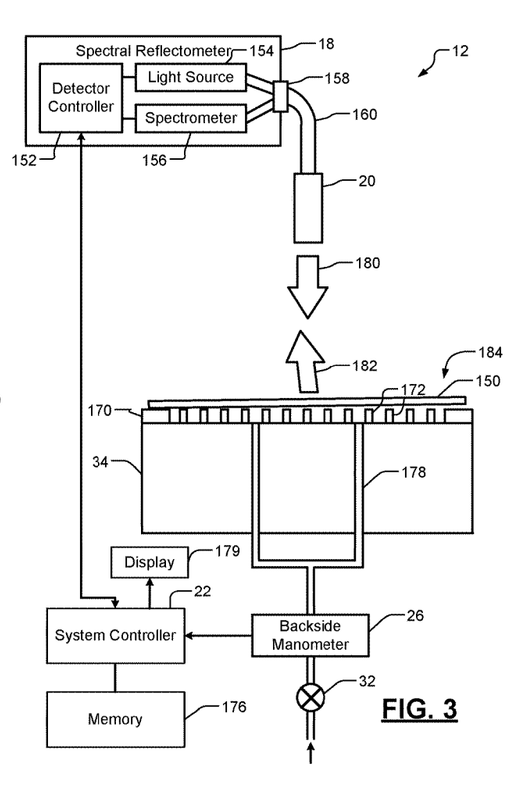
FIG. 3 is a functional block diagram of the partial unclamping detection system of FIG. 1 illustrating a partially clamped state.

Referring now also to FIG. 3, which shows the partial unclamping detection system 12 and illustrates a partially clamped state. The partial unclamping detection system 12, as shown, includes the spectral reflectometer 18, the collimator 20, the system controller 22, the backside manometer 26, the valve 32, and the ESC 34. The spectral reflectometer 18 may include the detector controller 152, the light source 154, the spectrometer 156, the interface 158, and/or other hardware for emission and reception of light signals.

The substrate 150, as shown, illustrates one example partially unclamped state. The partially unclamped detection systems disclosed herein may detect other partially unclamped states. In this example, when light is emitted from the collimator 20, as indicated by arrow 180, the light is not reflected back along approximately the same path that was originally used to emit the light due to the angle at which the substrate 150 is disposed. This is indicated by arrow 182. As shown, a portion 184 of the substrate 150 has been lifted above the ESC 34 and is not in contact with the ESC 34 and/or the ring 170.

This shift in the position of the substrate 150 from the target position and fully clamped state, as shown in FIG. 2, to the partially unclamped state shown in FIG. 3 causes changes in the output of the spectral reflectometer 18 and increased flow rate of the backside gas. The changes are detected by the system controller 22, which determines based on these changes that a partially unclamping event has occurred.

The parameters measured, detected, determined and/or calculated may be stored in a memory 176. Alert signals may be generated and indicated to a system operator via, for example, a display 179 or other alerting device (e.g., a speaker for providing an audible alert).

Figure 4:
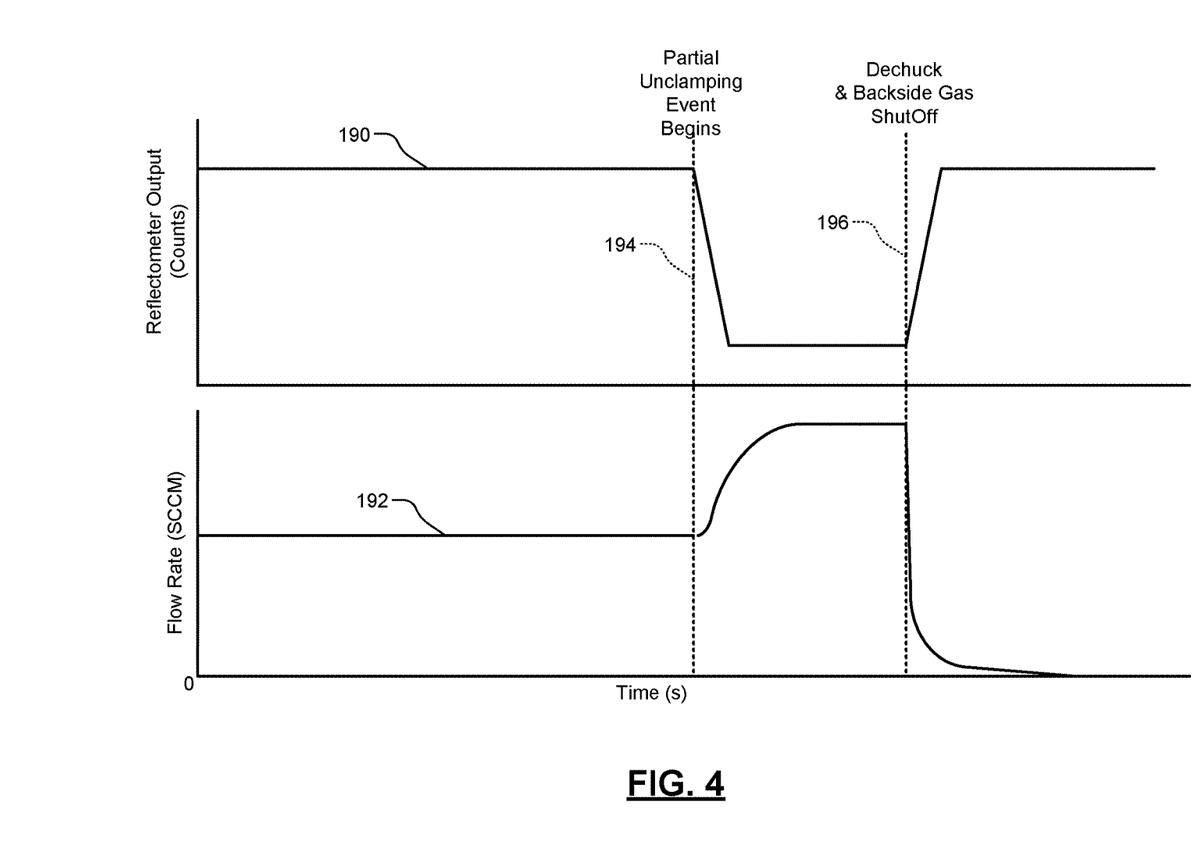
FIG. 4 is a graph including example plots of an output of a spectral reflectometer and a flow rate of a backside gas illustrating changes during a partial unclamping event.

FIG. 4 shows a graph including plots 190, 192 respectively of an output of a spectral reflectometer and a flow rate of a backside gas illustrating changes due to a partial unclamping event. A first vertical line 194 is shown indicating when a partial unclamping event begins. A second vertical line 196 is shown indicating when a corresponding substrate is dechucked (i.e. sufficiently removed or separated from an ESC based on predetermined criteria) and a backside gas is shutoff. As shown, the number of counts may decrease and the flow rate of the backside gas increases during and subsequent to partial unclamping of the corresponding substrate. Although shown as decreasing, the number of counts may increase, depending on the changes in wavelengths between the emitted light and the received reflected light. The output signal associated with the plot 190 may be indicative of the changes for a single wavelength of light or may represent a collective overall change for multiple wavelengths of light.

When the substrate is dechucked and the backside gas is shutoff, the output of the spectral reflectometer may return to a similar state as when the substrate was in the fully clamped state. As shown, the output of the spectral reflectometer subsequent to the point in time associated with line 196, may increase back to a same or similar level as it was prior to the partial unclamping event. The flow rate of the backside gas drops to zero when the backside gas is shutoff, which may occur, for example, when the valve 32 of FIGS. 1-3 is closed.

Figure 5:
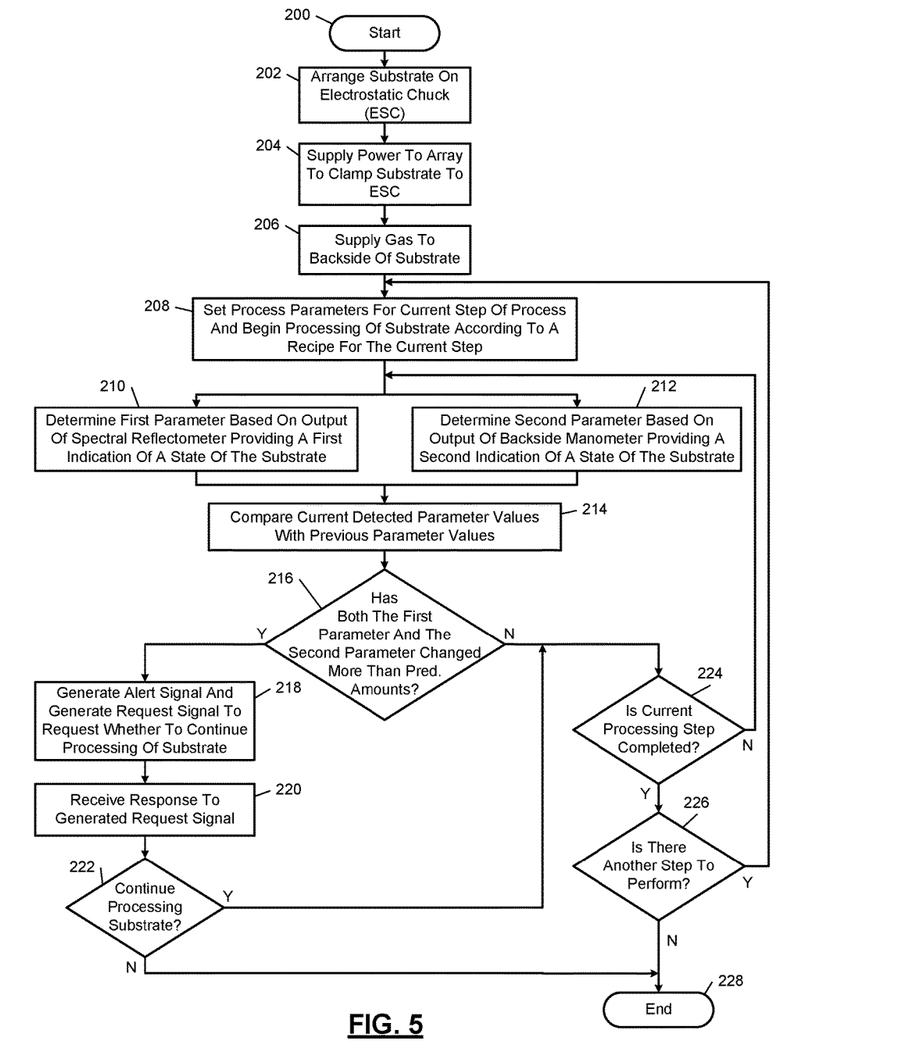
FIG. 5 illustrates a partial unclamping detection method in accordance with an embodiment of the present disclosure.

The systems disclosed herein may be operated using numerous methods, an example method is illustrated in FIG. 5. In FIG. 5, a partial unclamping detection method of operating a partial unclamping detection system is shown. Although the following operations are primarily described with respect to the implementations of FIGS. 1-3, the operations may be easily modified to apply to other implementations of the present disclosure. The operations may be iteratively performed.

The method may begin at 200. At 202, a substrate is arranged on an electrostatic chuck (e.g., the ESC 34). At 204, the system controller 22 supplies power via the power source 112 to electrodes of the ESC 34 to electrostatically clamp the substrate to the ESC 34.

At 206, the system controller 22 opens the valve 32 to supply backside gas to an area (e.g., the area 174) between the substrate and the ESC 34. The system controller 22 may adjust a position of the valve 32 to regulate and/or set a pressure of the backside gas to match a predetermined or set pressure. The flow rate and pressure may be set to provide a predetermined amount of cooling of the substrate and/or to set one or more temperatures of the substrate to one or more predetermined temperatures.

At 208, the system controller 22 may set or adjust the flow rate, the pressure and/or temperature of the backside gas and/or set other process parameters for a current processing step. This may be based on a recipe for the current processing step. As an example, the other processing parameters may include: RF bias voltages; pressures and/or flow rates of reactive gases and/or other process gases; and/or other processing parameters.

At 210, the system controller 22 receives the output of the spectral reflectometer 18. The system controller 22 may determine a first parameter based on the output of the spectral reflectometer 18. As an example, the first parameter may be a number of counts for one or more wavelengths of reflected light received at the spectral reflectometer 18. As another example, counts for multiple wavelengths of reflected light (or first set of parameters) received at the spectral reflectometer 18. The parameters provide a first indication of a state of the substrate.

At 212, the system controller 22 may determine a second parameter (or second set of parameters) based on an output of the backside manometer 26 and a position of the valve 32. The second parameter may be a flow rate of the backside gas. This provides a second indication of a state of the substrate.

At 214, the system controller 22 may compare values of the parameters determined during operations 210, 212 with previously determined and/or historical values for the same parameters. The previously determined and/or historical values may be values previously determined while the substrate was in an initial target position and in a fully clamped state and/or values associated with a partially unclamped state. The historical values may be values determined and stored in the memory 176 for previously performed processing steps for the substrate or for other substrates. In one embodiment, the values of the parameters may be compared to predetermined values for the parameters. In another embodiment, the values of the parameters may be compared to values determined by other processing systems for the same processing step.

At 216, the system controller 22, based on results of the comparisons performed at 214, determines whether a partial unclamping event has occurred. This may include, for example, determining whether the first parameter (or first set of parameters) and the second parameter (or second set of parameters) are indicative of a partial unclamping state. This may occur when: (Ai) the first parameter and/or first set of parameters change more than a first predetermined amount(s) and (Aii) the second parameter and/or second set of parameters increases by more than a second predetermined amount; (Bi) the first parameter and/or first set of parameters exceed first predetermined threshold(s) and (Bii) the second parameter and/or second set of parameters exceeds a second predetermined threshold; (Ci) the first parameter and/or first set of parameters are outside of first predetermined range(s) and (Cii) the second parameter and/or second set of parameters exceeds the second predetermined threshold(s); and/or (Di) differences between the first parameter and/or the first set of parameters and corresponding previous value(s) are greater than third predetermined thresholds (i.e. results of the comparisons performed at 210 exceed the third predetermined thresholds) and (Dii) a difference between the second parameter and/or second set of parameters and corresponding previous value(s) are greater than fourth predetermined threshold(s) (i.e. results of the comparisons performed at 212 exceed the fourth predetermined threshold(s)). The previous and/or historical values may be associated with the processing of other substrates being processed according to a same recipe as used to process the current substrate.

When a partial unclamping event has occurred, the detected changes in reflected light and flow rate of the backside gas are uncharacteristic of changes normally experienced when the substrate remains fully clamped. Changes in reflected light and flow rate of backside gas can occur due to changes in substrate surface structures during processing. These changes may be on the same order as the changes experienced during a partial unclamping event.

In one embodiment, a partial unclamped state is detected when the output of the spectral reflectometer 18 changes by 10% (±3%) or more and the flow rate of the backside gas increases by 25% (±5%) or more. If the output of the spectral reflectometer 18 changes by more than, for example, 10% or more and the flow rate of the backside gas does not increase by 25% or more, then a partial unclamping state may not have occurred. Similarly, if the output of the spectral reflectometer 18 does not change by more than, for example, 10% or more and the flow rate of the backside gas does increase by 25% or more, then a partial unclamping state may not have occurred. If a partially unclamped event has occurred, operation 218 is performed, otherwise operation 224 is performed.

Operations 214, 216 provide a first example algorithm with a first set of rules for detecting a partial unclamping state of a substrate. Other algorithms, sets of rules, and/or techniques may be used to detect a partial unclamping event. For example, machine learning may be used to detect and compare patterns of outputs of the spectral reflectometer 18, outputs of the backside manometer 26, positions of the valve 32, and/or other corresponding parameters, such as temperatures of the backside gas, to previously stored patterns to detect a partially unclamped state. A detected pattern of a set of the parameters disclosed herein may be compared to previous patterns to determine whether a partial unclamping event has occurred.

At 218, the system controller 22 may generate an alert signal indicating that a partial unclamping event has occurred. This may include providing an indication on the display 179. The system controller 22 may generate a request signal to request whether to continue processing of the substrate and/or check a preset flag (or bit) store in the memory 176 indicating whether to continue processing if a partial unclamping event occurs. A system operator may address the issue by ceasing further processing to minimize a number of substrates being scrapped.

At 220, the system controller 22 may receive a response signal or user input indicating whether to proceed with processing or stop processing of the substrate. The user input may be provided via the display 179 or other input device.

At 222, the system controller 22 determines whether to continue processing the substrate based on the response signal, the user input, and/or the state of the preset flag. Operation 224 is performed if processing is continued, otherwise the method may end at 228.

At 224, the system controller 22 determines whether the current processing step is completed. If the current processing step is completed, then operation 226 is performed, otherwise operations 210, 212 may be performed.

At 226, the system controller 22 determines whether another processing step is to be performed. Operation 208 may be performed if another processing step is performed, otherwise the method may end at 228.

The above-described operations are meant to be illustrative examples. The operations may be performed sequentially, synchronously, simultaneously, continuously, during overlapping time periods or in a different order depending upon the application. Also, any of the operations may not be performed or skipped depending on the implementation and/or sequence of events.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A partial unclamping detection system comprising:
   a light emission circuit configured to emit light at an area of a substrate while the substrate is electrostatically clamped to an electrostatic chuck of a substrate processing system;
   a spectrometer configured to detect light reflected off the substrate and generate a first output signal based on the detected light; and
   a system controller configured to
      detect changes in the first output signal,
      detect changes in a flow rate of a gas supplied to a backside of the substrate, and
      based on both the changes in the first output signal and the changes in the flow rate, determine whether a partial unclamping event of the substrate has occurred.

2. The partial unclamping detection system of claim 1, wherein if the partial unclamping event has occurred, then:
   at least a portion of the substrate has moved from an initial target position corresponding to a fully clamped state to a partial unclamped position corresponding to a partially unclamped state; and
   a difference laterally or vertically between the initial target position and the partial unclamped position, for the at least a portion of the substrate, is greater than a predetermined amount or within a predetermined range associated with the partially unclamped state.

3. The partial unclamping detection system of claim 1, further comprising:
   a valve configured to adjust the flow rate of the gas; and
   a manometer configured to detect a pressure of the gas supplied to the backside of the substrate,
   wherein the system controller is configured to, based on the pressure of the gas, adjust the flow rate of the gas by adjusting a position of the valve.

4. The partial unclamping detection system of claim 1, further comprising a spectral reflectometer comprising:
   the light emission circuit comprising a light source and a collimator;
   the spectrometer; and
   a detector controller,
   wherein
      the detector controller is configured to control operation of the light source and generate a second output signal based on the first output signal, and
      the system controller is configured to determine whether the partial unclamping event has occurred based on the second output signal.

5. The partial unclamping detection system of claim 4, wherein the system controller is configured to determine the partial unclamping event has occurred when (i) a parameter of the second output signal has changed more than a first predetermined amount, and (ii) the flow rate of the gas has increased more than a second predetermined amount.

6. The partial unclamping detection system of claim 4, wherein the system controller is configured to determine the partial unclamping event has occurred when (i) a parameter of the second output signal has changed and is greater than or equal to a first predetermined amount or outside a predetermined range, and (ii) the flow rate of the gas has increased and is greater than or equal to a second predetermined amount.

7. The partial unclamping detection system of claim 4, wherein the system controller is configured to (i) compare the second output signal and the flow rate to previous values, and (ii) based on results of the comparisons, determine that the partial unclamping event has occurred.

8. The partial unclamping detection system of claim 1, wherein the system controller is configured to determine the partial unclamping event has occurred when (i) a parameter of the first output signal has changed more than a first predetermined amount, and (ii) the flow rate of the gas has increased more than a second predetermined amount.

9. The partial unclamping detection system of claim 1, wherein the system controller is configured to determine the partial unclamping event has occurred when (i) a parameter of the first output signal has changed to be greater than or equal to a first predetermined amount, and (ii) the flow rate of the gas has increased to be greater than or equal to a second predetermined amount.

10. The partial unclamping detection system of claim 1, wherein the system controller is configured to (i) compare the first output signal and the flow rate to previous values, and (ii) based on results of the comparisons, determine that the partial unclamping event has occurred.

11. The partial unclamping detection system of claim 1, further comprising:
the electrostatic chuck; and
a power source,
the system controller is configured to supply power to the electrostatic chuck to electrostatically clamp the substrate to the electrostatic chuck.

12. A partial unclamping detection method comprising:
emitting light at an area of a substrate while the substrate is electrostatically clamped to an electrostatic chuck of a substrate processing system;
detecting light reflected off the substrate and generating a first output signal based on the detected light;
detecting changes in the first output signal;
detecting changes in a flow rate of a gas supplied to a backside of the substrate; and
based on both the changes in the first output signal and the changes in the flow rate, determining whether a partial unclamping event of the substrate has occurred.

13. The partial unclamping detection method of claim 12, wherein if the partial unclamping event has occurred, then:
at least a portion of the substrate has moved from an initial target position corresponding to a fully clamped state to a partial unclamped position corresponding to a partially unclamped state; and
a difference laterally or vertically between the initial target position and the partially unclamped position, for the at least a portion of the substrate, is greater than a predetermined amount or within a predetermined range associated with the partial unclamped state.

14. The partial unclamping detection method of claim 12, further comprising:
controlling operation of a light source to emit the light at the area of the substrate;
generating a second output signal based on the first output signal; and
determining that the partial unclamping event has occurred based on the second output signal.

15. The partial unclamping detection method of claim 14, comprising determining the partial unclamping event has occurred when (i) a parameter of the second output signal has changed more than a first predetermined amount, and (ii) the flow rate of the gas has increased more than a second predetermined amount.

16. The partial unclamping detection method of claim 14, comprising determining the partial unclamping event has occurred when (i) a parameter of the second output signal has changed and is greater than or equal to a first predetermined amount or outside a predetermined range, and (ii) the flow rate of the gas has increased and is greater than or equal to a second predetermined amount.

17. The partial unclamping detection method of claim 14, further comprising:
comparing the second output signal and the flow rate to previous values; and
based on results of the comparisons, determining that the partial unclamping event has occurred.

18. The partial unclamping detection method of claim 14, comprising determining the partial unclamping event has occurred when (i) a parameter of the first output signal has changed more than a first predetermined amount, and (ii) the flow rate of the gas has increased more than a second predetermined amount.

19. The partial unclamping detection method of claim 12, comprising determining the partial unclamping event has occurred when (i) a parameter of the first output signal has changed to be greater than or equal to a first predetermined amount, and (ii) the flow rate of the gas has increased to be greater than or equal to a second predetermined amount.

20. The partial unclamping detection method of claim 12, further comprising:
comparing the first output signal and the flow rate to previous values; and
based on results of the comparisons, determining that the partial unclamping event has occurred.

* * * * *